(12) United States Patent
Yamaguchi et al.

(10) Patent No.: US 9,997,569 B2
(45) Date of Patent: Jun. 12, 2018

(54) MEMORY DEVICE

(71) Applicant: Toshiba Memory Corporation, Minato-ku (JP)

(72) Inventors: Marina Yamaguchi, Yokkaichi (JP); Shosuke Fujii, Kuwana (JP); Yuuichi Kamimuta, Yokkaichi (JP); Takayuki Ishikawa, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/227,053

(22) Filed: Aug. 3, 2016

(65) Prior Publication Data
US 2017/0040380 A1 Feb. 9, 2017

(30) Foreign Application Priority Data
Aug. 6, 2015 (JP) .................................. 2015-156257

(51) Int. Cl.
*H01L 27/24* (2006.01)
*H01L 45/00* (2006.01)

(52) U.S. Cl.
CPC ........ *H01L 27/249* (2013.01); *H01L 27/2463* (2013.01); *H01L 27/2481* (2013.01); *H01L 45/08* (2013.01); *H01L 45/085* (2013.01); *H01L 45/1233* (2013.01); *H01L 45/1246* (2013.01); *H01L 45/1253* (2013.01); *H01L 45/145* (2013.01)

(58) Field of Classification Search
CPC ............. H01L 45/1233; H01L 45/1266; H01L 45/146; H01L 45/08; H01L 45/085; H01L 27/2463; H01L 27/2481; H01L 45/1253
USPC .......................... 257/2, 4; 438/104, 382, 261
See application file for complete search history.

(56) References Cited

U.S. PATENT DOCUMENTS 8,860,002 B2 * 10/2014 Tendulkar ........... H01L 45/1253
257/4
2011/0233509 A1 * 9/2011 Shigeoka ............ H01L 27/2409
257/4

(Continued)

FOREIGN PATENT DOCUMENTS

JP 2012-124374 A 6/2012
JP 2012-199336 A 10/2012
(Continued)

*Primary Examiner* — Jonathan Han
(74) *Attorney, Agent, or Firm* — Oblon, McClelland, Maier & Neustadt, L.L.P.

(57) ABSTRACT

According to one embodiment, a memory device includes a first electrode, a second electrode, a first layer, and a second layer. The first electrode includes a first element. The first layer is provided between the first electrode and the second electrode. The first layer includes at least one of an insulator or a first semiconductor. The second layer is provided between the first layer and the second electrode. The second layer includes a first region and a second region. The second region is provided between the first region and the second electrode. The second region includes a second element. A standard electrode potential of the second element is lower than a standard electrode potential of the first element. A concentration of nitrogen in the first region is higher than a concentration of nitrogen in the second region.

10 Claims, 9 Drawing Sheets

(56) References Cited

U.S. PATENT DOCUMENTS

| | | | |
|---|---|---|---|
| 2011/0291063 A1* | 12/2011 | Kai | H01L 27/2409 |
| | | | 257/2 |
| 2012/0147656 A1 | 6/2012 | Sone | |
| 2012/0236625 A1 | 9/2012 | Ohba et al. | |
| 2013/0062590 A1* | 3/2013 | Sonehara | H01L 27/2409 |
| | | | 257/5 |
| 2013/0075844 A1 | 3/2013 | Miyano et al. | |
| 2013/0250656 A1* | 9/2013 | Ishikawa | H01L 45/04 |
| | | | 365/148 |
| 2014/0008603 A1* | 1/2014 | Takahashi | H01L 45/14 |
| | | | 257/4 |
| 2014/0284535 A1 | 9/2014 | Saitoh et al. | |
| 2015/0184283 A1* | 7/2015 | Tendulkar | C23C 14/5806 |
| | | | 204/192.21 |

FOREIGN PATENT DOCUMENTS

| | | |
|---|---|---|
| JP | 2013-070008 A | 4/2013 |
| JP | 2013-197420 A | 9/2013 |

* cited by examiner

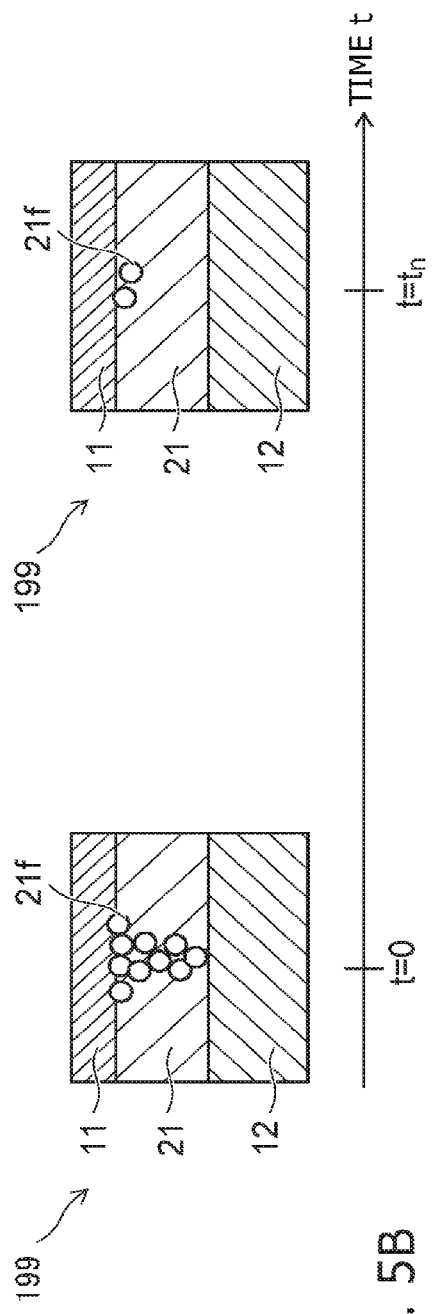
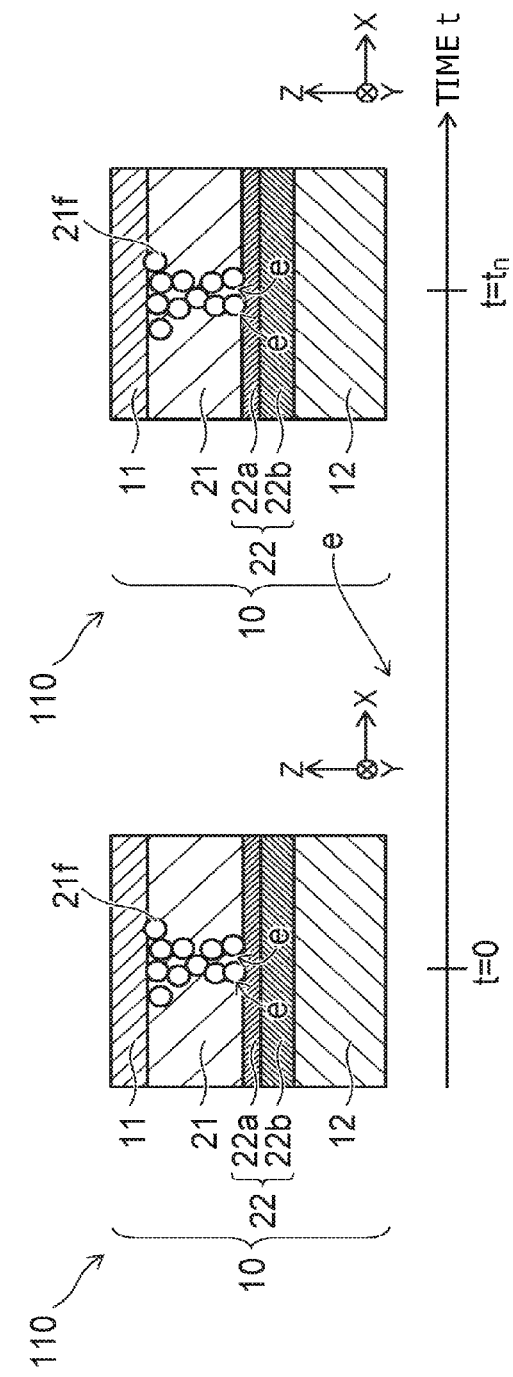

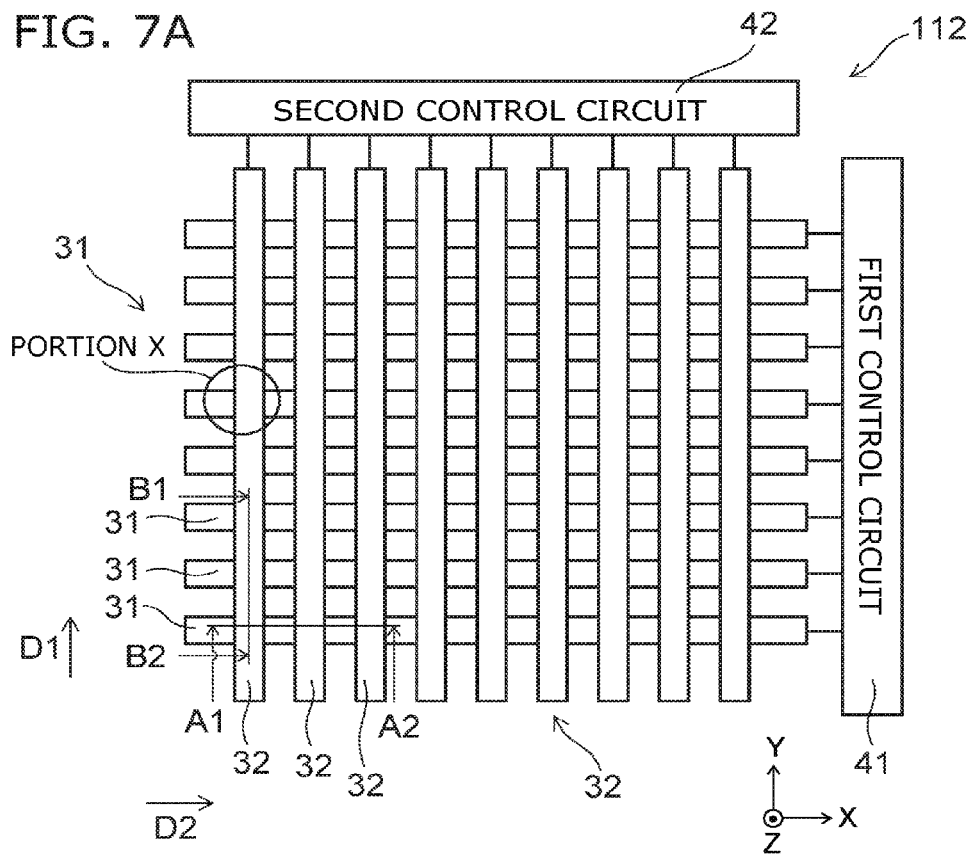
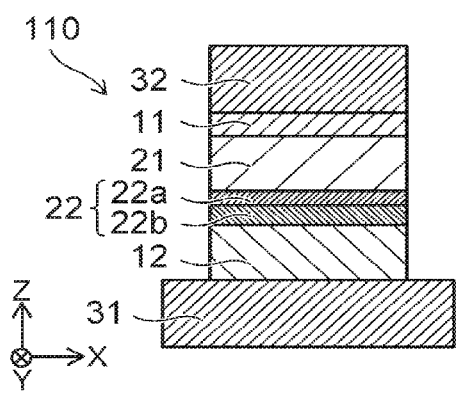
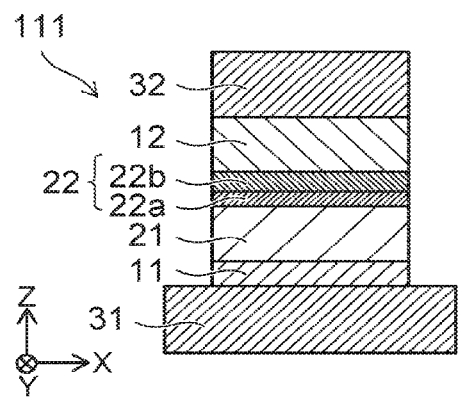

MEMORY DEVICE

CROSS-REFERENCE TO RELATED APPLICATIONS

This application is based upon and claims the benefit of priority from Japanese Patent Application No. 2015-156257, filed on Aug. 6, 2015; the entire contents of which are incorporated herein by reference.

FIELD

Embodiments described herein relate generally to a memory device.

BACKGROUND

Cross-point resistance random access memory is used as a memory device. Good data retention characteristics are desirable in such a memory device.

BRIEF DESCRIPTION OF THE DRAWINGS

FIG. 5A and FIG. 5B are schematic views showing transition states of the filaments of the memory devices;

FIG. 7A to FIG. 7C are schematic views showing a cross-point memory device according to a third embodiment;

DETAILED DESCRIPTION

Figure 1:
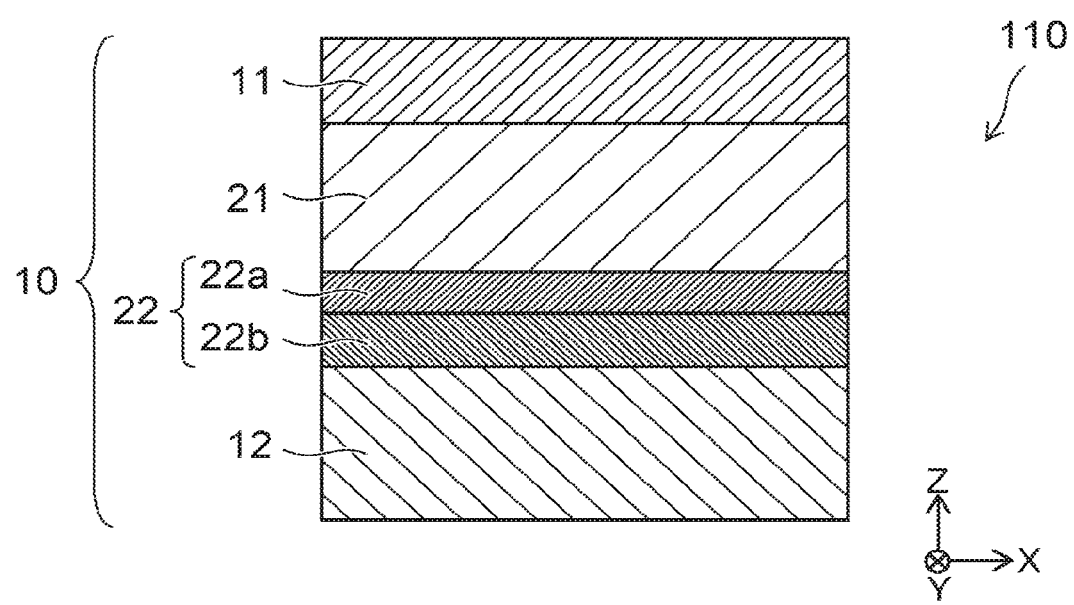
FIG. 1 is a schematic cross-sectional view showing a memory device according to a first embodiment.

According to one embodiment, a memory device includes a first electrode, a second electrode, a first layer, and a second layer. The first electrode includes a first element. The first layer is provided between the first electrode and the second electrode. The first layer includes at least one of an insulator or a first semiconductor. The second layer is provided between the first layer and the second electrode. The second layer includes a first region and a second region. The second region is provided between the first region and the second electrode. The first region includes nitrogen. The second region includes a second element. A standard electrode potential of the second element is lower than a standard electrode potential of the first element. A concentration of nitrogen in the first region is higher than a concentration of nitrogen in the second region, or the second region does not include nitrogen.

According to one embodiment, a memory device includes a first electrode, a second electrode, a first layer, and a second layer. The first electrode includes silver. The second electrode includes at least one of amorphous silicon or polysilicon. The first layer is provided between the first electrode and the second electrode. The first layer includes a compound including silicon and oxygen. The second layer is provided between the first layer and the second electrode. The second layer includes a first region and a second region. The second region is provided between the first region and the second electrode. The first region includes nitrogen. The second region includes titanium. A concentration of nitrogen in the first region is higher than a concentration of nitrogen in the second region, or the second region does not include nitrogen.

A memory device includes a plurality of first interconnects, a plurality of second interconnects, a control circuit, and a plurality of memory portions. The first interconnects extends in a first direction and separated from each other in a direction crossing the first direction. The second interconnects extends in a second direction crossing the first direction and separated from each other in a direction crossing the second direction. The second interconnects are separated from the first interconnects in a third direction crossing the first direction and the second direction. The control circuit is connected with the first interconnects and the second interconnects. The memory portions provided between the first interconnects and the second interconnects. Each of the memory portions includes a first electrode and a second electrode, a first layer, and a second layer. The first electrode is provided between one of the first interconnects and one of the second interconnects. The second electrode is provided between the first electrode and the one of the second interconnects. The first layer is provided between the first electrode and the second electrode. The first layer includes at least one of an insulator or a first semiconductor. The second layer is provided between the first layer and the second electrode. The second layer includes a first region and a second region. The second region is provided between the first region and the second electrode. The first region includes nitrogen. The second region includes a second element. A standard electrode potential of the second element is lower than a standard electrode potential of the first element. A concentration of nitrogen in the first region is higher than a concentration of nitrogen in the second region, or the second region does not include nitrogen.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing a memory device according to a first embodiment.

As shown in FIG. 1, the memory device 110 according to the embodiment includes a stacked body 10. The stacked body 10 includes a first electrode 11, a second electrode 12, a first layer 21, and a second layer 22. The memory device 110 is, for example, a nonvolatile memory device.

The first layer 21 is provided between the first electrode 11 and the second electrode 12. The second layer 22 is provided between the first layer 21 and the second electrode 12. The second layer 22 includes a first region 22a and a second region 22b. The second region 22b is provided between the first region 22a and the second electrode 12. In the example, the first electrode 11 contacts the first layer 21. The first layer contacts the first region 22a; and the first region 22a contacts the second region 22b. The second electrode 12 contacts the second region 22b.

A stacking direction from the second layer 22 toward the first layer 21 is taken as a Z-axis direction. One direction perpendicular to the Z-axis direction is taken as an X-axis direction. One direction perpendicular to the Z-axis direction and the X-axis direction is taken as a Y-axis direction.

The first electrode 11 includes a first element. The first element includes a metal that is ionized easily, an alloy of such metals, a chalcogenide material, etc. The first element includes at least one selected from the group consisting of silver (Ag), copper (Cu), nickel (Ni), cobalt (Co), aluminum (Al), titanium (Ti), and tantalum (Ta).

The second electrode 12 includes a second semiconductor. The second semiconductor includes at least one of amorphous silicon or polysilicon. The second electrode 12 is provided to be separated from the first electrode 11 in the Z-axis direction. The second electrode 12 may include a metallic element (e.g., an impurity). In the case where a metallic element is included, the content ratio of the metallic element is, for example, not less than $10^{15}$ atoms/cm$^3$ and not more than $10^{21}$ atoms/cm$^3$.

The first layer 21 functions as a variable resistance layer. The first layer 21 includes at least one of an insulator or a first semiconductor. At least one of silicon oxide, silicon nitride, or a metal oxide is included as the insulator. The material of the first semiconductor includes, for example, at least one of silicon or germanium, etc. A voltage is applied between the first electrode 11 and the second electrode 12. Thereby, the electrical resistance of the first layer 21 transitions between a state (a low resistance state) in which the resistance is low and a state (a high resistance state) in which the resistance is higher than the low resistance state. In other words, due to the voltage application, a current path (a filament) is formed in the first layer 21; and the electrical resistance of the stacked body 10 changes.

The second layer 22 includes a first region 22a and a second region 22b. The first region 22a functions as a barrier metal layer. The first region 22a includes at least one of titanium nitride (TiN), tantalum nitride (TaN), tungsten nitride (WN), or tantalum silicon nitride (TaSiN).

The second region 22b functions as an electron supply layer. The second region 22b includes a second element. The second element includes at least one selected from the group consisting of titanium (Ti), zirconium (Zr), aluminum (Al), tantalum (Ta), and iron (Fe).

In the embodiment, the standard electrode potential of the second element of the second layer 22 is lower than the standard electrode potential of the first element of the first electrode 11. The concentration of nitrogen in the first region 22a is higher than the concentration of nitrogen in the second region 22b, or the second region does not include nitrogen.

The concentration of nitrogen in the second region 22b may be zero, or below the detection limit. The second region 22b may not include the nitrogen. These cases are included in a state in which "the concentration of nitrogen in the first region 22a is higher than the concentration of nitrogen in the second region 22b".

For example, the standard electrode potential of Ti (the second element) is lower than the standard electrode potential of Ag (the first element). The standard electrode potential $E^0$ of Ag is, for example, +0.7991 V; and the standard electrode potential $E^0$ of Ti is, for example, −1.63 V. A Ag filament is formed in the first layer 21 when a voltage is applied to the first electrode 11. The Ti of the second layer 22 functions as a reducing agent of the Ag filament. That is, the ionization of the Ti occurs before the dissolution (the ionization) of the Ag filament. Accordingly, the electrons generated by the ionization of the Ti continue to be supplied to the Ag filament. Therefore, even after the removal of the voltage, the dissolution of the Ag filament is suppressed; and good data retention characteristics can be obtained.

In the embodiment, for example, the first region 22a includes TiN; the second region 22b includes Ti; and the second electrode 12 includes amorphous silicon (a-Si). In other words, the memory device 110 has a three-layer structure of TiN/Ti/a-Si.

For example, by including a-Si in the material of the second electrode 12, the dielectric breakdown of the element caused by a large current that starts to flow abruptly in the set operation (reducing the resistance of the element) can be suppressed. The current that flows in the element after setting is limited by the resistance of the a-Si. The a-Si also functions as a solid electrolyte layer in the oxidization of the Ti. Therefore, the oxidization of the Ti is promoted; and as a result, the reduction of the Ag also is promoted.

Ti is an ionizable element and functions as an electron supply layer to the Ag filament inside the first layer 21 (e.g., $SiO_2$). TiN has the function of suppressing reactions between Ti and $SiO_2$. If Ti and $SiO_2$ contact each other without TiN interposed, $TiO_x$ is undesirably produced in the interface between the Ti and the $SiO_2$. Thereby, a state occurs in which ionization is difficult; and the Ti can no longer function as the reducing agent of the Ag. In the embodiment, the production of $TiO_x$ can be suppressed by providing TiN between the $SiO_2$ and the Ti.

The memory device 110 is shown as one type of a resistance random access memory element. A memory element of this type can change the resistance value of the element by applying a voltage and can retain this state even after removing the voltage. Thereby, data can be stored nonvolatilely. Generally, a resistance random access memory element has a simple structure having two terminals. Therefore, downscaling/higher integration of the element is easy; and high-speed operations of microsecond order or less are possible. Therefore, it is possible to realize a memory cell array having higher performance than NAND flash memory.

As a resistance random access memory element according to the embodiment, there is an ionic memory in which Ag is used as the ion source (the first electrode); and a silicon oxide film is included in the variable resistance layer (the first layer). Such an ionic memory is particularly desirable because of the affinity with existing processes and because operations at a low current are possible. In the ionic memory, the resistance value of the element is changed by the precipitation/dissolution of the Ag filament formed by the voltage application.

When a positive voltage is applied to the first electrode 11, the metal ions of the first electrode 11 diffuse; and a filament is formed inside the first layer 21. Thereby, the element transitions from a high resistance state to a low resistance state (a set state). Thus, the voltage when the element transitions from the high resistance state to the low resistance state is called the set voltage. The state in which the filament is formed inside the first layer 21 and the element has a low resistance is retained even after the voltage removal.

On the other hand, when a negative voltage is applied to the first electrode 11 of the element in the low resistance state in which the filament is formed, the filament inside the first layer 21 is dissolved and returns to the first electrode 11 side. Thereby, the element transitions from the low resistance state to the high resistance state (a reset state). Thus, the voltage when the element transitions from the low resistance state to the high resistance state is called the reset voltage.

In the case where the thickness of the first electrode 11 is too thin, the metal ions necessary for forming the filament in the first layer 21 are not supplied sufficiently. Therefore, it is difficult to obtain a stable set state. On the other hand, in the case where the thickness of the first electrode 11 is too thick, the patterning is difficult in the formation of the memory cell array. Accordingly, it is desirable for the thickness of the first electrode 11 to be, for example, not less than 1 nanometer (nm) and not more than 50 nm. It is more desirable to be 10 nm or less.

The leakage current increases easily if the thickness of the first layer 21 is too thin. It is desirable for the thickness of the first layer 21 to be, for example, not less than 2 nm and not more than 50 nm. It is more desirable to be 10 nm or less. Thereby, for example, the leakage current can be suppressed.

For the ionic memory, the inventors discovered that a trade-off relationship exists between reducing the set voltage and improving the data retention characteristics of the ionic memory. Namely, in the case where the ion source is ionized easily or diffuses easily, that is, in the case of a low set voltage, the filament that is formed inside the variable resistance layer similarly is ionized easily or is diffused easily. Therefore, it is difficult to retain the data for a long period of time after setting. On the other hand, in the case where the ion source does not diffuse easily or is not ionized easily, the data retention characteristics are improved; but the set voltage is undesirably high.

Figure 2A:
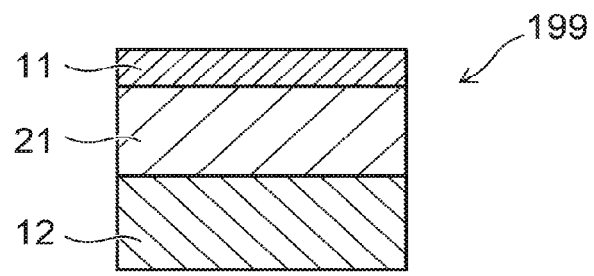
FIG. 2A to FIG. 2C are schematic views showing a memory device according to a first reference example.
Figure 2B:
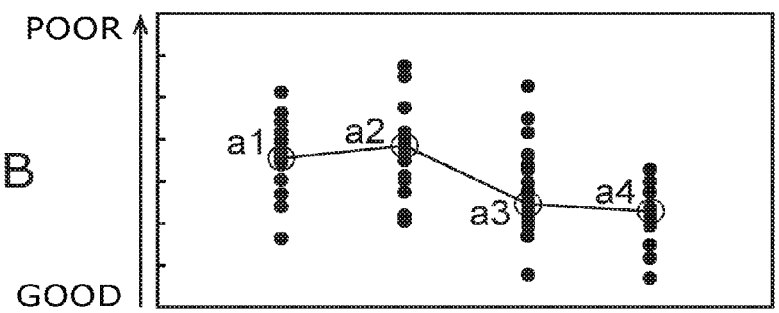
Figure 2C:
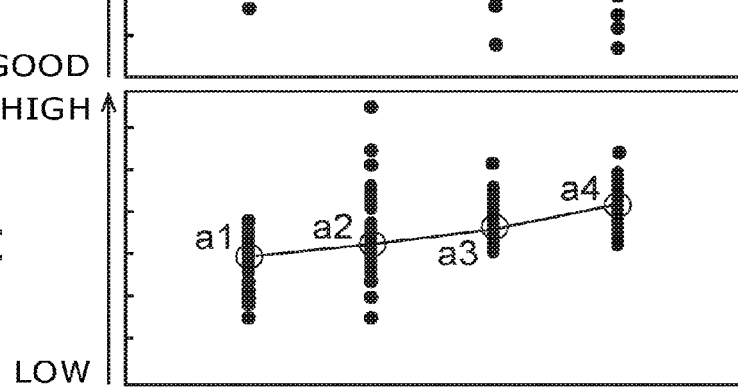

FIG. 2A to FIG. 2C are schematic views showing a memory device according to a first reference example.

FIG. 2A is a schematic cross-sectional view showing the memory device.

FIG. 2B is a graph of the data retention characteristics.

FIG. 2C is a graph of the set voltage characteristics.

As shown in FIG. 2A, the memory device 199 according to the reference example includes the first electrode 11, the first layer 21 (the variable resistance layer), and the second electrode 12. The first layer 21 is provided between the first electrode 11 and the second electrode 12.

As shown in FIG. 2B and FIG. 2C, the characteristics when the first electrode 11 is formed by first to fourth processes a1 to a4 are plotted.

In the graph shown in FIG. 2B, the data retention characteristics degrade toward the direction of the arrow of the vertical axis. In other words, the filament dissolves (ionizes) easily toward the direction of the arrow. The data retention characteristics degrade as the ease of ionization increases (the data retention characteristics improve as the difficulty of ionization increases). For the fourth process a4 in the example, it is most difficult to dissolve the filament; and the data retention characteristics are good. In other words, the data retention characteristics improve in the order of the second process a2, the third process a3, and the fourth process a4.

In the graph shown in FIG. 2C, the set voltage increases toward the direction of the arrow of the vertical axis. In the example, the set voltage is highest for the fourth process a4. In other words, the set voltage increases in the order of the second process a2, the third process a3, and the fourth process a4. That is, the ionization of the filament becomes more difficult and the set voltage increases as the filament stabilizes and the data retention characteristics improve.

Figure 3A:
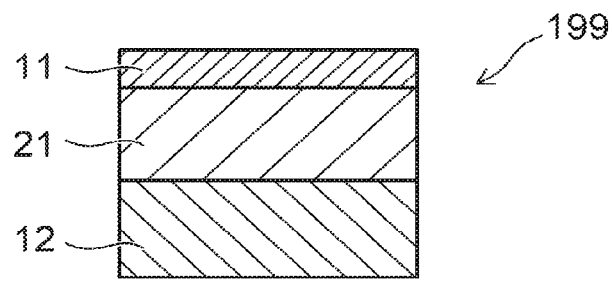
FIG. 3A to FIG. 3C are schematic views showing a memory device according to a second reference example.
Figure 3B:
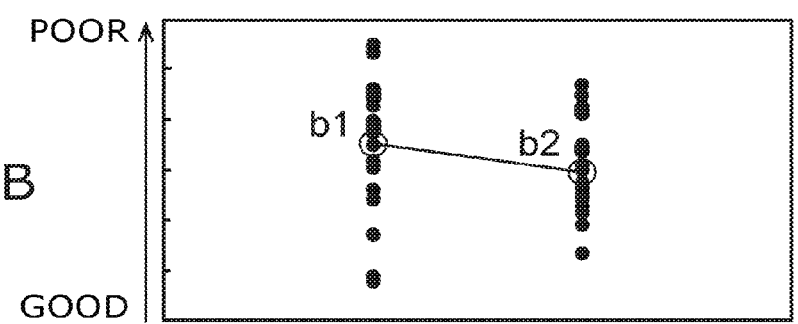
Figure 3C:
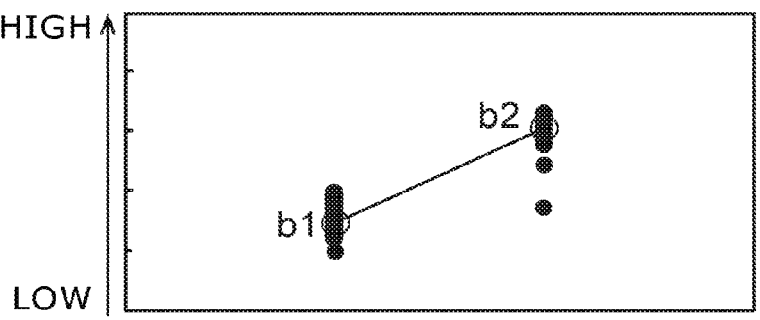

FIG. 3A to FIG. 3C are schematic views showing a memory device according to a second reference example.

FIG. 3A is a schematic cross-sectional view showing the memory device.

FIG. 3B is a graph of the data retention characteristics.

FIG. 3C is a graph of the set voltage characteristics.

As shown in FIG. 3A, the memory device 199 according to the reference example includes the first electrode 11, the first layer 21 (the variable resistance layer), and the second electrode 12. The first layer 21 is provided between the first electrode 11 and the second electrode 12.

As shown in FIG. 3B and FIG. 3C, the characteristics when the first layer 21 is formed by a first process b1 and a second process b2 are plotted.

In the graph shown in FIG. 3B, the data retention characteristics degrade toward the direction of the arrow of the vertical axis. In other words, the filament dissolves (ionizes) easily toward the direction of the arrow. The data retention characteristics degrade as the ease of ionization increases (the data retention characteristics improve as the difficulty of ionization increases). In the example, compared to the case where the first process b1 is used, the filament does not dissolve easily and the data retention characteristics are good in the case where the second process b2 is used.

In the graph shown in FIG. 3C, the set voltage increases toward the direction of the arrow of the vertical axis. In the example, the set voltage of the second process b2 is higher than the set voltage of the first process b1. That is, similarly to the first reference example, as the filament stabilizes and the data retention characteristics improve, the ionization of the filament becomes more difficult; and the set voltage increases.

In the two reference examples recited above, a trade-off relationship exists between reducing the set voltage and improving the data retention characteristics. In the process improvement of the first electrode 11 (the ion source) or the process improvement of the first layer 21 (the variable resistance layer), it is difficult to improve only the data retention characteristics while maintaining the set voltage. In the reference example, it is difficult to reduce only the set voltage while maintaining the retention characteristics.

Figure 4A:
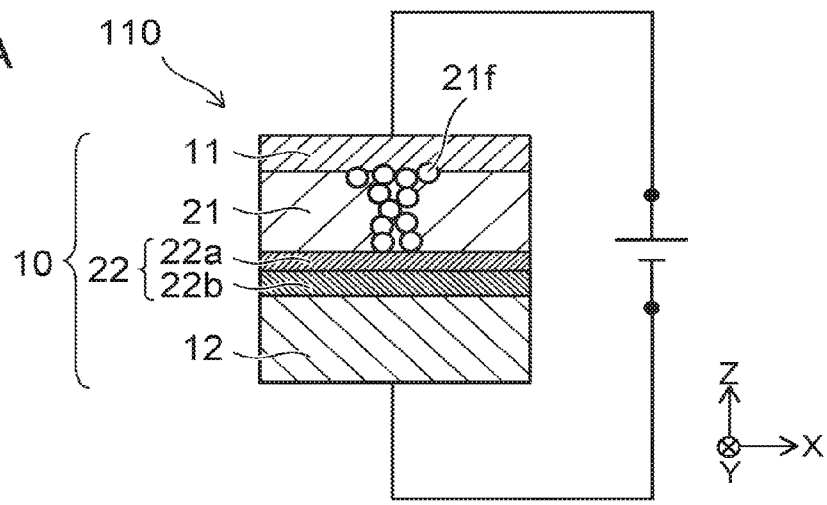
FIG. 4A to FIG. 4C are schematic cross-sectional views showing the memory device according to the first embodiment.
Figure 4B:
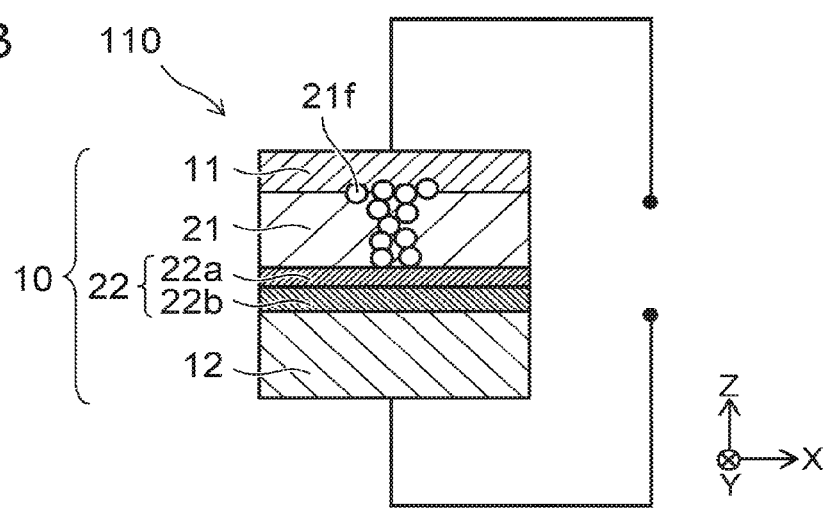
Figure 4C:
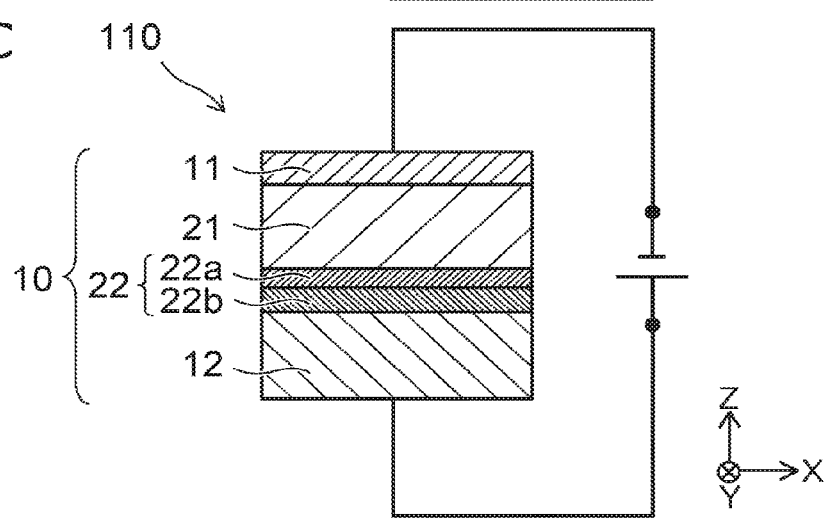

FIG. 4A to FIG. 4C are schematic cross-sectional views showing the memory device according to the first embodiment.

When a positive voltage is applied to the first electrode 11 as shown in FIG. 4A, a filament 21*f* is formed inside the first layer 21; and the memory device 110 transitions to the low resistance state (the set state). Then, in the memory device 110 as shown in FIG. 4B, the supply of electrons from the second region 22*b* via the first region 22*a* to the filament 21*f* continues after the voltage is removed. Thereby, the degradation over time of the filament 21*f* is suppressed. Then, when a negative voltage is applied to the first electrode 11 as shown in FIG. 4C, the filament 21*f* inside the first layer 21 is dissolved; and the memory device 110 transitions to the high resistance state (the reset state). In other words, the electrical resistance between the first electrode 11 and the second electrode 12 has a first value when a voltage that is positive with respect to the second electrode 12 is applied to the first electrode 11, and has a second value higher than the first value when a voltage that is negative with respect to the second electrode 12 is applied to the first electrode 11.

In the structure of the embodiment, it is sufficient to provide, between the first layer 21 and the second electrode 12, the second layer 22 including a metal having a low resistance value. Therefore, a set voltage equal to that of a conventional structure in which the second layer 22 is not inserted between the first layer 21 and the second electrode 12 can be maintained. According to the embodiment, good data retention characteristics can be realized without increasing the set voltage.

FIG. 5A and FIG. 5B are schematic views showing transition states of the filaments of the memory devices.

FIG. 5A is a schematic view showing the transition states of the filament of the memory device according to the reference example.

FIG. 5B is a schematic view showing the transition states of the filament of the memory device according to the first embodiment.

When a positive voltage is applied to the first electrode 11 at time t=0 as shown in FIG. 5A, the filament 21f is formed in the first layer 21; and the memory device 199 according to the reference example transitions to the low resistance state (the set state). However, if left idle after setting, the filament 21f dissolves and the state transitions to the high resistance state (the reset state) as time elapses ($t=t_n$).

Conversely, when a positive voltage is applied to the first electrode 11 at time t=0 as shown in FIG. 5B, the filament 21f is formed in the first layer 21; and the memory device 110 according to the embodiment transitions to the low resistance state (the set state). Then, even when the device is left idle after setting and time elapses ($t=t_n$), the dissolution of the filament 21f is suppressed; and the filament 21f is retained stably.

In other words, according to the embodiment of FIG. 5B, the first electrode 11 includes the first element. The filament 21f is formed of the first element inside the first layer 21. The second region 22b includes the second element and supplies the electrons e of the second element via the first region 22a to the filament 21f. The standard electrode potential of the second element is lower than the standard electrode potential of the first element. Therefore, the ionization in the second region 22b occurs before the filament 21f dissolves (ionizes). The electrons e that are generated by the ionization of the second region 22b continue to be supplied to the filament 21f. Therefore, the dissolution (the ionization) of the filament 21f is suppressed; and the filament 21f is retained stably even after being retained for a long period of time.

Thus, according to the embodiment, the metal of the second region 22b functions as a reducing agent of the filament 21f. Thereby, the data retention characteristics can be good. Both the first region 22a and the second region 22b include a low-resistance metal. Therefore, the increase of the set voltage is not caused. According to the embodiment, good data retention characteristics can be realized without increasing the set voltage.

The semiconductor layer (the second semiconductor) of the second electrode 12 functions as a solid electrolyte that promotes the ionization of the second region 22b. The first region 22a functions as a barrier metal, suppresses physical reactions that may occur between the first layer 21 and the second region 22b, and suppresses the formation of a layer (an interface layer) having poor film properties at the interface. The first region 22a electrically connects the second region 22b to the filament 21f so that the supply of the electrons e from the second region 22b to the filament 21f is performed reliably.

In the case where the thickness of the first region 22a is too thin, the physical reactions that may occur at the interface between the first layer 21 and the second region 22b cannot be suppressed sufficiently. On the other hand, in the case where the thickness of the first region 22a is too thick, the supply of the electrons e from the second region 22b to the filament 21f becomes insufficient. Therefore, it is desirable for the thickness of the first region 22a to be, for example, not less than 1 nm and not more than 50 nm. It is more desirable to be 10 nm or less.

In the case where the thickness of the second region 22b is too thin, the supply of the electrons e to the filament 21f becomes insufficient. On the other hand, in the case where the thickness of the second region 22b is too thick, similarly to the case of the first electrode 11, the patterning is difficult. Accordingly, it is desirable for the thickness of the second region 22b to be, for example, not less than 1 nm and not more than 50 nm. It is more desirable to be 10 nm or less.

It is desirable for the thickness of the second electrode 12 to be, for example, not less than 1 nm and not more than 50 nm. It is more desirable to be 30 nm or less.

For example, the materials and structures according to the embodiment can be confirmed by cross-sectional structure observation using a transmission electron microscope (TEM) and by elemental analysis/composition analysis using energy dispersive X-ray spectrometry.

In the manufacturing method according to the embodiment, a general film formation method can be used to form the second electrode 12, the second region 22b, the first region 22a, the first layer 21, and the first electrode 11 in order. For example, physical vapor deposition (PVD) typified by sputtering and the like, chemical vapor deposition (CVD), etc., can be used.

The data retention characteristics are improved in the embodiment. The filament 21f is more difficult to dissolve in the embodiment than in the reference example. Accordingly, it may be considered that there is a possibility of a state occurring in the embodiment in which is difficult to reset (the reset voltage is high). However, the filament 21f that is formed inside the first layer 21 is clustered; and the individual clusters are in a discontinuous state. Therefore, an electric field is applied to the insulating film portion between the clusters. Therefore, it is considered unlikely that a state may occur in which it is difficult to reset (the reset voltage is high).

The material of the second region 22b also is a material that can be ionized. Therefore, it may be considered that there is a possibility that a filament of this material may be formed inside the first layer 21 when applying the reset voltage. However, in the structure of the embodiment, the first region 22a that includes a material having good diffusion prevention properties such as, for example, TiN or the like is provided between the second region 22b and the first layer 21. Therefore, the movement of the metal ions of the second region 22b is suppressed by the first region 22a. Accordingly, it is considered unlikely that the second region 22b may cause setting, that is, the formation of a filament inside the first layer 21.

A Ag/$SiO_2$ element structure in which the first electrode 11 includes Ag and the first layer 21 includes $SiO_2$ will now be compared to a Ti/$SiO_2$ element structure in which the first electrode 11 includes Ti and the first layer 21 includes $SiO_2$. The set voltage of the Ti/$SiO_2$ element structure is higher than the set voltage of the Ag/$SiO_2$ element structure; and it was found experimentally that it is difficult for Ti to form a filament.

In the embodiment as described above, the dielectric breakdown of the element caused by the large current that abruptly starts to flow in the set operation (reducing the resistance of the element) can be suppressed. For example, in the case where the material of the second electrode 12 includes a-Si, the current that flows in the element after setting is limited by the resistance of the a-Si. That is, by the second electrode 12 including the second semiconductor, the flow of the large current in the element is suppressed; and the dielectric breakdown can be suppressed. This was found experimentally.

In the embodiment described above, the case is described where the first layer 21 that functions as the variable resistance layer is a single layer. For example, the first layer 21 may have a multilayered structure in which insulating films including at least one of a silicon oxide film, a silicon nitride film, or a metal oxide film are stacked. In the case where the first layer 21 has a stacked structure, for example, multiple films such as a stacked structure of $SiO_2$ and $SiO_x$ (0<x<2) that are of the same type and have different film properties such as the density, etc., may be stacked. In such a case, the layer having the low density may be formed on the side contacting the first electrode 11, and the layer having the high density may be formed under the layer having the low density; or the layers may be formed in the reverse order. For example, the first layer 21 may include stacked films of different types such as $HfO_2$, $SiO_2$, etc. In such a case, the film having the high dielectric constant may be formed on the side contacting the first electrode 11; or the films may be formed in the reverse order. Thus, even in the case where the first layer 21 is multiply stacked, the data retention characteristics can be improved.

Second Embodiment

Figure 6:
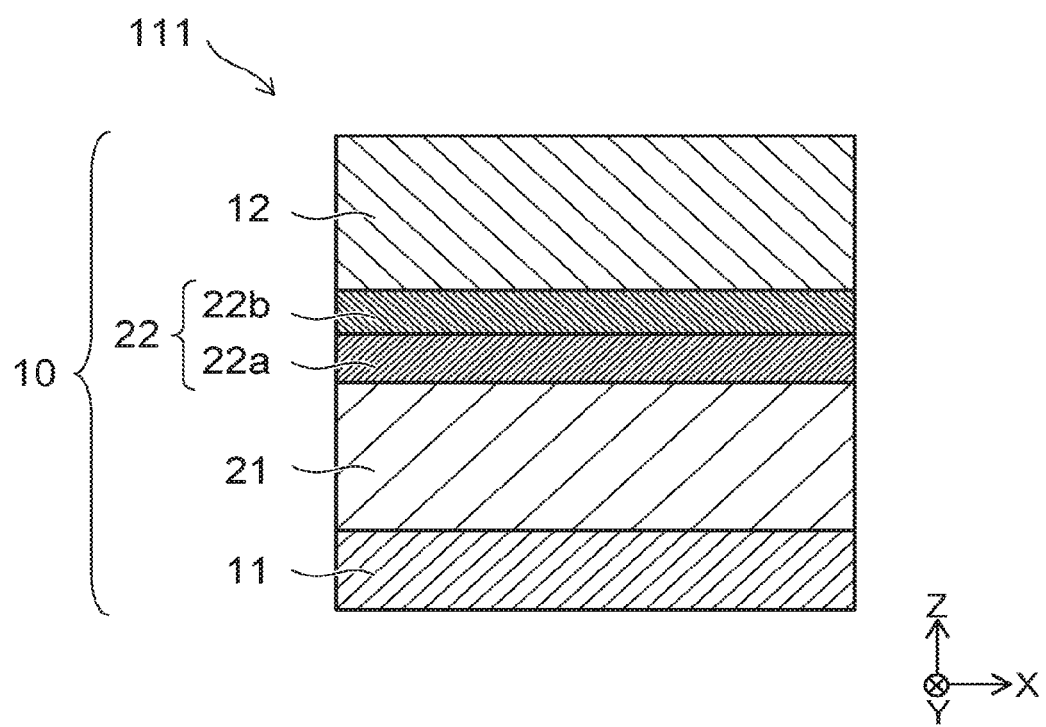
FIG. 6 is a schematic cross-sectional view showing a memory device according to a second embodiment.

FIG. 6 is a schematic cross-sectional view showing a memory device according to a second embodiment.

In the memory device 111 according to the embodiment as shown in FIG. 6, the stacked structure of the memory device 110 is vertically reversed. In other words, in the memory device 111, the second electrode 12, the second region 22b, the first region 22a, the first layer 21, and the first electrode 11 are stacked in order from above. The memory device 111 is, for example, a nonvolatile memory device.

In the structure according to the embodiment as well, the data retention characteristics can be improved similarly to the structure of the first embodiment. The data retention characteristics can be improved without increasing the set voltage.

Third Embodiment

FIG. 7A to FIG. 7C are schematic views showing a cross-point memory device according to a third embodiment.

FIG. 7A is a schematic plan view showing the cross-point memory device. The cross-point memory device is, for example, a nonvolatile memory device.

FIG. 7B is an enlarged view of a portion X cross section in which the memory device 110 according to the first embodiment is disposed.

FIG. 7C is an enlarged view of a portion X cross section in which the memory device 111 according to the second embodiment is disposed.

In the cross-point memory device 112 as shown in FIG. 7A to FIG. 7C, the memory device 110 according to the first embodiment or the memory device 111 according to the second embodiment is disposed at the intersection (portion X) between a lower interconnect 31 and an upper interconnect 32.

The cross-point memory device 112 is shown as a semiconductor memory device in which the memory device 110 (or the memory device 111) is included in a memory cell array. The memory device 110 (or the memory device 111) is independent of the connection method and is applicable to any semiconductor memory device. For example, the memory device is applicable also to a cross-point three-dimensionally stacked structure.

The cross-point memory device 112 includes the multiple lower interconnects 31 (the second interconnects), the multiple upper interconnects 32 (the first interconnects), a first control circuit 41, and a second control circuit 42.

The multiple upper interconnects 32 extend in a first direction D1 and are separated from each other in a direction crossing the first direction D1. The multiple lower interconnects 31 are separated from the multiple upper interconnects 32 in a stacking direction (a third direction) crossing the first direction D1 and the direction crossing the first direction D1. The multiple lower interconnects 31 extend in a second direction D2 crossing the first direction and are separated from each other in a direction crossing the second direction D2.

For example, the multiple lower interconnects 31 are arranged in a first direction D1 and extend in a second direction D2 intersecting the first direction. The first direction D1 is, for example, the Y-axis direction. The second direction D2 is, for example, the X-axis direction. One end of each of the multiple lower interconnects 31 is connected to the first control circuit 41 that drives the memory device 110. The multiple upper interconnects 32 are arranged in the second direction D2 and extend in the first direction D1. One end of each of the multiple upper interconnects 32 is connected to the second control circuit 42 that drives the memory device 110. In the example, the multiple lower interconnects 31 and the multiple upper interconnects 32 are orthogonal to each other.

Figure 8A:
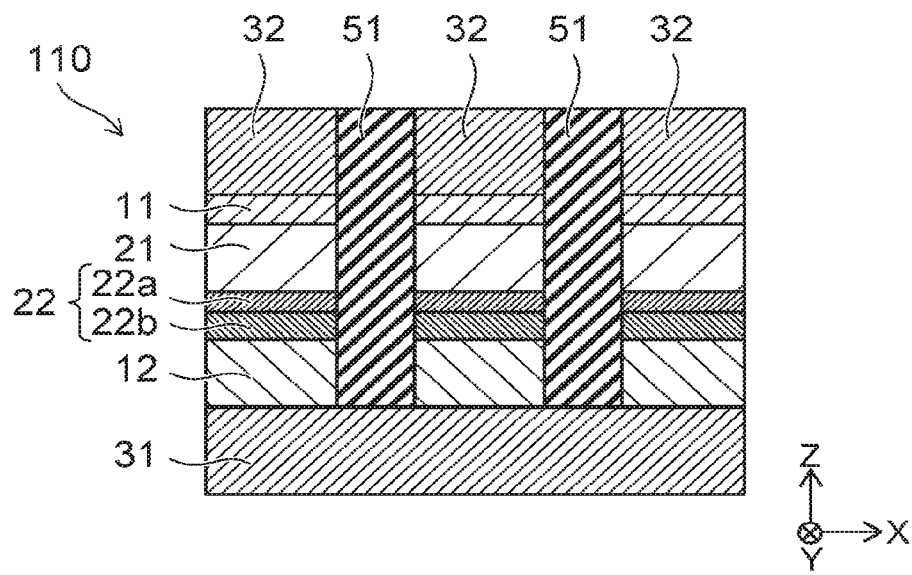
FIG. 8A and FIG. 8B are schematic cross-sectional views showing the cross-point memory device according to the third embodiment.
Figure 8B:
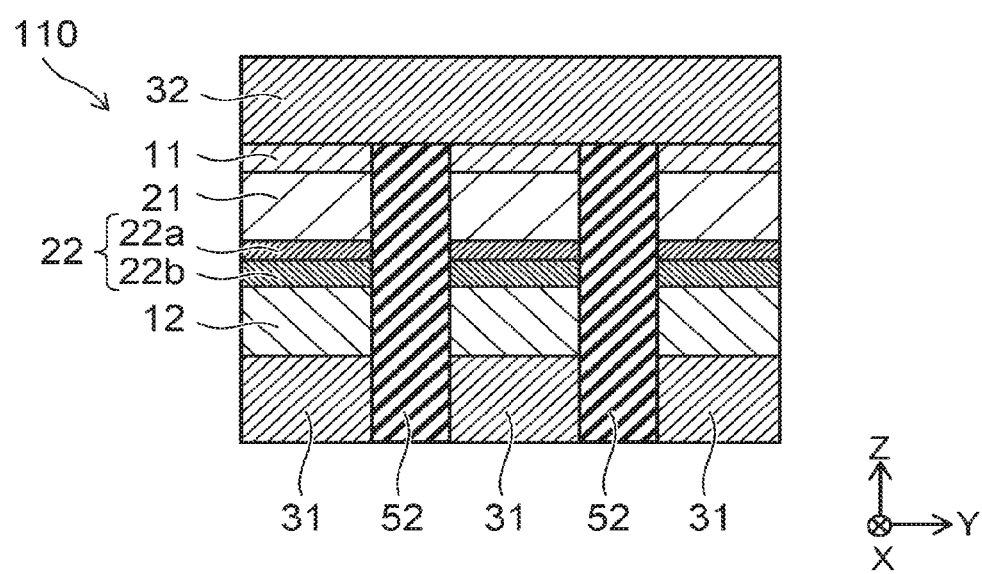

FIG. 8A and FIG. 8B are schematic cross-sectional views showing the cross-point memory device according to the third embodiment.

FIG. 8A is a schematic view showing an A1-A2 cross section of FIG. 7A.

FIG. 8B is a schematic view showing a B1-B2 cross section of FIG. 7A.

For example, the memory device 110 according to the first embodiment is provided at the intersection (portion X) between the lower interconnect 31 and the upper interconnect 32. The memory device 111 according to the second embodiment may be provided at the intersection (portion X). The upper interconnect 32 is connected to the upper portion of the first electrode 11; and the lower interconnect 31 is connected to the lower portion of the second electrode 12. The multiple memory devices 110 are disposed inside the memory cell array.

In other words, the multiple memory portions (for example, the memory device 110) are provided between the multiple upper interconnects 32 and the multiple lower interconnects 31. Each of the memory portions includes the first electrode 11, the second electrode 12, the first layer 21, and the second layer 22. The first electrode 11 is provided between the upper interconnects 32 and the lower interconnects 31. The second electrode 12 is provided between the lower interconnects 31 and the first electrode 11. The first layer 21 is provided between the first electrode 11 and the second electrode 12. The second layer 22 is provided between the first layer 21 and the second electrode 12.

As shown in FIG. 8A, a first inter-layer insulating film 51 is disposed between the mutually-adjacent upper interconnects 32. Similarly, the first inter-layer insulating film 51 is disposed between the mutually-adjacent memory devices 110. The mutually-adjacent upper interconnects 32 are electrically isolated from each other by the first inter-layer insulating film 51; and the mutually-adjacent memory devices 110 are electrically isolated from each other by the first inter-layer insulating film 51. As shown in FIG. 8B, a second inter-layer insulating film 52 is disposed between the mutually-adjacent lower interconnects 31. Similarly, the second inter-layer insulating film 52 is disposed between the mutually-adjacent memory devices 110. The mutually-adjacent lower interconnects 31 are electrically isolated from each other by the second inter-layer insulating film 52; and the mutually-adjacent memory devices 110 are electrically isolated from each other by the second inter-layer insulating film 52.

Thus, by disposing the inter-layer insulating films between the mutually-adjacent interconnects (elements), electrical leaks via the memory cells between the mutually-adjacent interconnects do not occur. Accordingly, the leakage current between the interconnects can be suppressed.

Fourth Embodiment

Figure 9A:
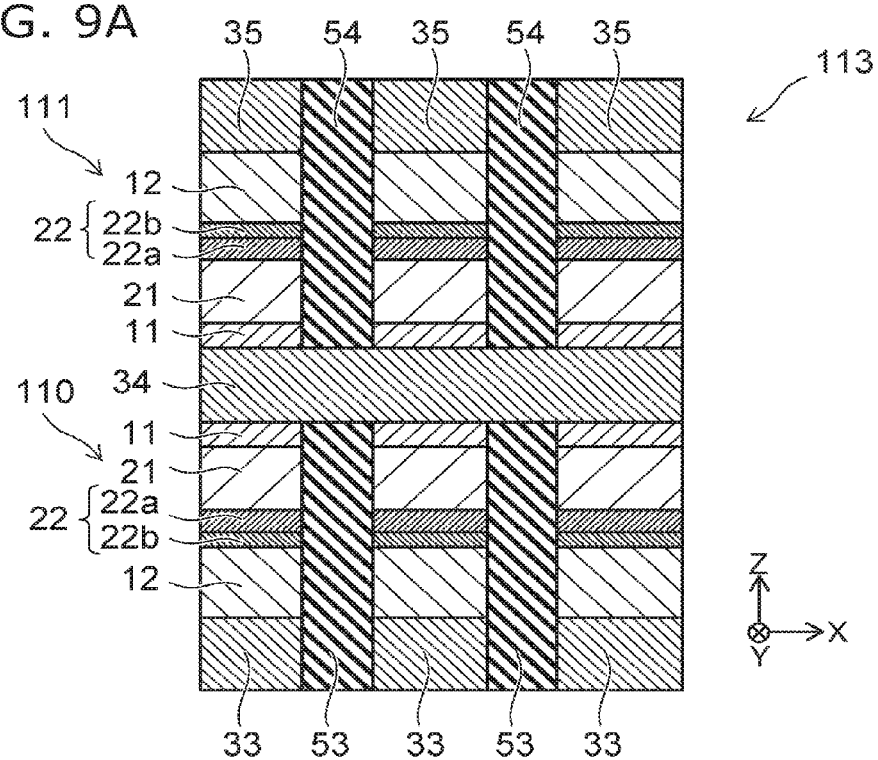
FIG. 9A and FIG. 9B are schematic cross-sectional views showing a cross-point memory device according to a fourth embodiment.
Figure 9B:
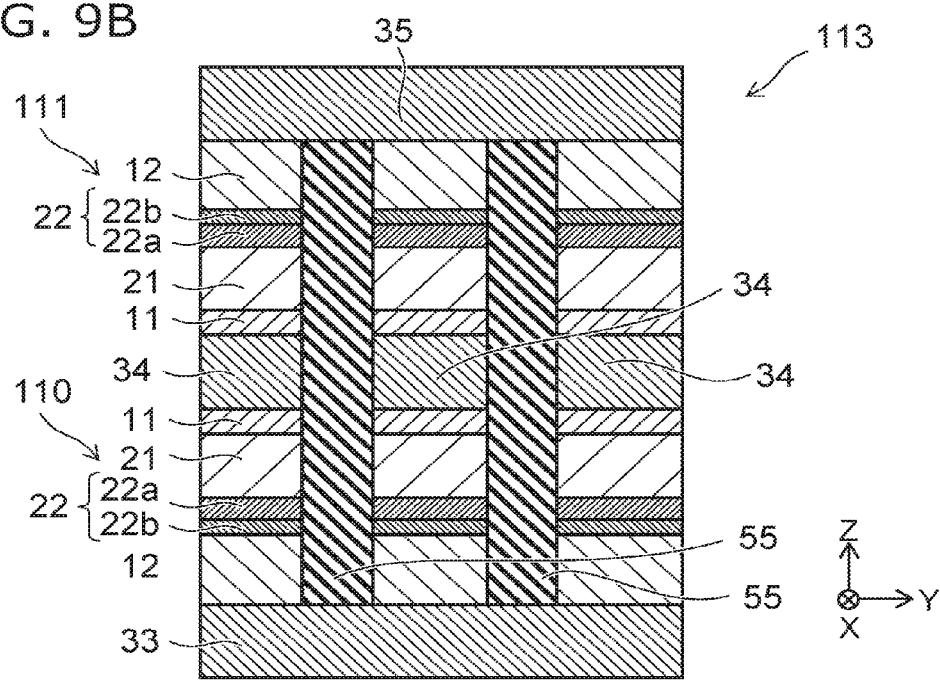

FIG. 9A and FIG. 9B are schematic cross-sectional views showing a cross-point memory device according to a fourth embodiment.

FIG. 9A is a schematic view showing the A1-A2 cross section of FIG. 7A.

FIG. 9B is a schematic view showing the B1-B2 cross section of FIG. 7A.

The memory device 111 according to the first embodiment and the memory device 110 according to the second embodiment are provided in the stacking direction at the intersection (portion X) of the cross-point memory device 113 according to the embodiment. In other words, the cross-point memory device 113 has a three-dimensionally stacked structure; and two resistance random access memory elements are stacked at the intersection (portion X).

The cross-point memory device 113 includes multiple lower interconnects 33, multiple intermediate interconnects 34, and multiple upper interconnects 35. The intermediate interconnects 34 are provided between the lower interconnects 33 and the upper interconnects 35. The memory devices 111 are provided between the upper interconnects 35 and the intermediate interconnects 34. The memory devices 110 are provided between the intermediate interconnects 34 and the lower interconnects 33.

In other words, the intermediate interconnect 34 is shared by the memory device 110 and the memory device 111. The memory device 110 and the memory device 111 are disposed vertically symmetrically with the intermediate interconnect 34 as a reference. For the memory device 110, the lower portion of the second electrode 12 is connected to the lower interconnect 33. For the memory device 111, the upper portion of the second electrode 12 is connected to the upper interconnect 35.

As shown in FIG. 9A, a third inter-layer insulating film 53 is disposed between the mutually-adjacent lower interconnects 33. Similarly, the third inter-layer insulating film 53 is disposed between the mutually-adjacent memory devices 110. The mutually-adjacent lower interconnects 33 are electrically isolated from each other by the third inter-layer insulating film 53; and the mutually-adjacent memory devices 110 are electrically isolated from each other by the third inter-layer insulating film 53. A fourth inter-layer insulating film 54 is disposed between the mutually-adjacent upper interconnects 35. Similarly, the fourth inter-layer insulating film 54 is disposed between the mutually-adjacent memory devices 111. The mutually-adjacent upper interconnects 35 are electrically isolated from each other by the fourth inter-layer insulating film 54; and the mutually-adjacent memory devices 111 are electrically isolated from each other by the fourth inter-layer insulating film 54.

As shown in FIG. 9B, a fifth inter-layer insulating film 55 is disposed between the mutually-adjacent intermediate interconnects 34. Similarly, the fifth inter-layer insulating film 55 is disposed between the mutually-adjacent memory devices 110; and the fifth inter-layer insulating film 55 is disposed between the mutually-adjacent memory devices 111. The mutually-adjacent intermediate interconnects 34 are electrically isolated from each other by the fifth inter-layer insulating film 55; the mutually-adjacent memory devices 110 are electrically isolated from each other by the fifth inter-layer insulating film 55; and the mutually-adjacent memory devices 111 are electrically isolated from each other by the fifth inter-layer insulating film 55.

Thus, by the two memory devices sharing one interconnect (the intermediate interconnect), it is possible to reduce the materials, the number of processes necessary to form the interconnects, etc. Thereby, it is possible to reduce the manufacturing cost and further downsize the memory cell array.

In the description recited above, the interconnect on the side contacting the first electrode 11 of the memory device (the resistance random access memory element) is provided separately from the first electrode 11. The first electrode 11 may include the interconnect. That is, the first electrode 11 and the interconnect may be configured as one body. In such a case as well, it is possible to reduce the materials and the number of processes necessary to form the interconnects. Therefore, it is possible to reduce the manufacturing cost and further downsize the memory cell array.

A selector element may be provided between the first electrode 11 and the interconnect contacting the first electrode 11. A selector element may be provided between the second electrode 12 and the interconnect contacting the second electrode 12. In the case where the first electrode 11 includes the interconnect, the selector element may be provided between the second electrode 12 and the interconnect contacting the second electrode 12. For example, a diode, etc., may be used as the selector element. By providing such a selector element, stray current which often is a problem in the cross-point structure can be suppressed; and the reliability of the array operations increases.

According to the embodiment as described above, the data retention characteristics improve. For example, a cross-point memory device that includes a memory device having a low set voltage and good retention characteristics can be provided.

According to the embodiments, a memory device having good data retention characteristics can be provided.

Hereinabove, embodiments of the invention are described with reference to specific examples. However, the invention is not limited to these specific examples. For example, one skilled in the art may similarly practice the invention by appropriately selecting specific configurations of components such as the first electrode, the second electrode, the first layer, the second layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all memory devices practicable by an appropriate design modification by one skilled in the art based on the memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
    a first electrode including a first element including at least one selected from a group consisting of silver, copper, nickel, cobalt, and aluminum;
    an amorphous silicon electrode;
    a first layer provided between the first electrode and the amorphous silicon electrode, the first layer including a compound including silicon and oxygen; and
    a second layer provided between the first layer and the amorphous silicon electrode, the second layer including a first region and a second region, the second region being provided between the first region and the amorphous silicon electrode, the second region physically contacting the first region and the amorphous silicon electrode, the first region including nitrogen and at least one selected from a group consisting of titanium, tungsten, and tantalum, the second region including a second element,
    a standard electrode potential of the second element being lower than a standard electrode potential of the first element,
    the second region including nitrogen and a concentration of nitrogen in the first region being higher than a concentration of nitrogen in the second region.

2. The device according to claim 1, wherein the first region includes at least one selected from the group consisting of titanium nitride, tantalum nitride, tungsten nitride, and tantalum silicon nitride.

3. The device according to claim 1, wherein the second element includes at least one selected from the group consisting of titanium, zirconium, aluminum, tantalum, and iron.

4. The device according to claim 1, wherein the first element includes silver.

5. The device according to claim 1, wherein the second element includes titanium.

6. The device according to claim 1, wherein an electrical resistance between the first electrode and the amorphous silicon electrode is a first value when a voltage positive with respect to the amorphous silicon electrode is applied to the first electrode, and the electrical resistance is a second value when a voltage negative with respect to the amorphous silicon electrode is applied to the first electrode, the second value is higher than the first value.

7. The device according to claim 1, further comprising:
    a first interconnect extending in a first direction, the first interconnect being electrically connected to the first electrode, the first direction intersecting a direction from the second layer toward the first layer; and
    a second interconnect extending in a second direction, the second interconnect being electrically connected to the second electrode, the second direction intersecting the first direction and intersecting the direction from the second layer toward the first layer.

8. The device according to claim 1, wherein the second region does not include silicon.

9. A memory device, comprising:
    a first electrode including silver;
    an amorphous silicon electrode;
    a first layer provided between the first electrode and the amorphous silicon electrode, the first layer including a compound including silicon and oxygen; and
    a second layer provided between the first layer and the amorphous silicon electrode, the second layer including a first region and a second region, the second region being provided between the first region and the amorphous silicon electrode, the second region physically contacting the first region and the amorphous silicon electrode, the first region including nitrogen and titanium, the second region including nitrogen and titanium,
    a concentration of nitrogen in the first region being higher than a concentration of nitrogen in the second region.

10. The device according to claim 9, wherein the second region does not include silicon.

* * * * *